United States Patent
Kreiner et al.

(10) Patent No.: US 12,211,826 B2
(45) Date of Patent: Jan. 28, 2025

(54) METHOD FOR PRODUCING A LIGHTING DEVICE

(71) Applicant: OSRAM Opto Semiconductors GmbH, Regensburg (DE)

(72) Inventors: Laura Kreiner, Regensburg (DE); Jens Mueller, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 338 days.

(21) Appl. No.: 17/769,407

(22) PCT Filed: Dec. 14, 2020

(86) PCT No.: PCT/EP2020/085958
§ 371 (c)(1),
(2) Date: Apr. 15, 2022

(87) PCT Pub. No.: WO2021/122449
PCT Pub. Date: Jun. 24, 2021

(65) Prior Publication Data
US 2022/0399314 A1 Dec. 15, 2022

(30) Foreign Application Priority Data
Dec. 17, 2019 (DE) ................. 10 2019 134 756.4

(51) Int. Cl.
*H01L 25/075* (2006.01)
*H01L 21/66* (2006.01)
*H01L 33/00* (2010.01)

(52) U.S. Cl.
CPC .......... *H01L 25/0753* (2013.01); *H01L 22/12* (2013.01); *H01L 33/0095* (2013.01)

(58) Field of Classification Search
CPC .. H01L 25/0753; H01L 22/12; H01L 33/0095
See application file for complete search history.

(56) References Cited

U.S. PATENT DOCUMENTS

| 8,722,462 B2 | 5/2014 | Elian et al. |
| 9,653,642 B1 | 5/2017 | Raring et al. |

(Continued)

FOREIGN PATENT DOCUMENTS

| DE | 102011001306 A1 | 10/2011 |
| DE | 102011056706 A1 | 6/2013 |

(Continued)

OTHER PUBLICATIONS

Forsberg F., et al., "Batch Transfer of Radially Expanded Die Arrays for Heterogeneous Integration Using Different Wafer Sizes," Journal of Microelectromechanical Systems, vol. 21, No. 5, Oct. 2012, 7 pages.

*Primary Examiner* — Victor A Mandala
*Assistant Examiner* — Colleen E Snow
(74) *Attorney, Agent, or Firm* — Slater Matsil, LLP (57) ABSTRACT

In an embodiment a method for producing a lighting device includes providing a wafer assemblage having a semiconductor layer sequence arranged on a carrier substrate, separating the wafer assemblage into a plurality of first optoelectronic semiconductor chips, each comprising a section of the semiconductor layer sequence and of the carrier substrate, transferring at least some of the first optoelectronic semiconductor chips to a first auxiliary carrier, wherein the first auxiliary carrier has contact pads on a main surface, wherein the contact pads are surrounded and delimited in each case by a contour, and wherein each of the first optoelectronic semiconductor chips is arranged on a contact pad, cutting, on the first auxiliary carrier, to size the first optoelectronic semiconductor chips in order to adapt the first optoelectronic semiconductor chips to a predefined shape such that the each first optoelectronic semiconductor chip lies completely within the contour of an assigned contact (Continued)

pad, and transferring the first optoelectronic semiconductor chips from the first auxiliary carrier to a carrier.

17 Claims, 5 Drawing Sheets

(56) References Cited

U.S. PATENT DOCUMENTS

| | | | |
|---|---|---|---|
| 9,780,271 | B2 | 10/2017 | Gebuhr et al. |
| 9,831,195 | B1 * | 11/2017 | Lu .......................... H01L 23/13 |
| 11,348,906 | B2 * | 5/2022 | Lim ....................... H01L 33/382 |
| 2019/0189477 | A1 | 6/2019 | Chen |

FOREIGN PATENT DOCUMENTS

| | | |
|---|---|---|
| EP | 2399062 A1 | 12/2011 |
| KR | 20190108768 A | 9/2019 |
| WO | 2017123780 A1 | 7/2017 |
| WO | 2018170352 A1 | 9/2018 |

\* cited by examiner

FIG 9E

METHOD FOR PRODUCING A LIGHTING DEVICE

This patent application is a national phase filing under section 371 of PCT/EP2020/085958, filed Dec. 14, 2020, which claims the priority of German patent application 102019134756.4, filed Dec. 17, 2019, each of which is incorporated herein by reference in its entirety.

TECHNICAL FIELD

A method for producing a lighting device is specified.

SUMMARY

Embodiments provide a method for producing a lighting device which is distinguished by a high yield and low costs.

In accordance with at least one embodiment of the method for producing a lighting device, a method step A) involves providing a wafer assemblage having a semiconductor layer sequence arranged on a carrier substrate. By way of example, the semiconductor layer sequence was epitaxially deposited on a growth substrate, for example by means of metal organic vapor phase epitaxy, MOVPE for short, or metal organic chemical vapor deposition, MOCVD for short, or by means of molecular beam epitaxy, MBE for short. By way of example, after the epitaxial deposition, the semiconductor layer sequence is transferred to the carrier substrate, which differs from the growth substrate. The growth substrate may have been detached in that case. Alternatively, the carrier substrate can be the growth substrate.

By way of example, the semiconductor layer sequence is based on a nitride compound semiconductor material, such as $Al_nIn_{1-n-m}Ga_mN$, for example, or on a phosphide compound semiconductor material, such as $Al_nIn_{1-n-m}Ga_mP$, for example, or on an arsenide compound semiconductor material, such as $Al_nIn_{1-n-m}Ga_mAs$, for example, where in each case $0 \leq n \leq 1$, $0 \leq m \leq 1$ and $m+n \leq 1$. Here the semiconductor layer sequence can comprise dopants and additional constituents. For the sake of simplicity, however, only the essential constituents of the crystal lattice of the semiconductor layer sequence, i.e. Al, As, Ga, In, N or P, are specified, even if these can be replaced and/or supplemented in part by small amounts of further substances.

The semiconductor layer sequence preferably comprises a p-conducting region, an n-conducting region and an active region arranged between the p-conducting and n-conducting regions. The active region serves for generating electromagnetic radiation. The active region includes in particular at least one quantum well structure in the form of a single quantum well, SQW for short, or in the form of a multi-quantum well, MQW for short, structure. The active region additionally includes a secondary well structure, preferably a plurality of secondary well structures. By way of example, electromagnetic radiation in the blue or green or red spectral range or in the UV range or IR range is generated in the active region during operation as intended.

The growth substrate comprises for example sapphire or carbide or silicon or silicon carbide or GaN or GaAs or consists of one of these materials. If the carrier substrate is different than the growth substrate, then the carrier substrate comprises for example silicone, silicon, epoxy, plastic or glass.

In accordance with at least one embodiment of the method, a method step B) involves separating the wafer assemblage into a multiplicity of first optoelectronic semiconductor chips each having a section of the semiconductor layer sequence and of the carrier substrate. By way of example, the wafer assemblage is severed by an etching method, such as plasma etching, for example. By way of example, the wafer assemblage is severed by a dicing method. The dicing method is parallel dicing or a laser-assisted dicing method, for example, in which before the wafer assemblage is diced, a laser is used to introduce defects into the wafer assemblage and thereby predefine target dicing locations, also known by the term stealth dicing. Advantageously, severing the wafer assemblage is possible in a simple and cost-effective manner using dicing methods.

Here and hereinafter a first semiconductor chip is understood to mean a separately handleable and electrically contactable element. The first semiconductor chip preferably comprises an originally continuous region of the semiconductor layer sequence grown in the wafer assemblage. The semiconductor layer sequence of the first semiconductor chip is preferably embodied in a continuous fashion. The lateral extent of the first semiconductor chip, measured parallel to the main extension direction of the active region, is for example at most 1% or at most 5% or at most 10% or at most 20% greater than the lateral extent of the active region of the first semiconductor chip.

In particular, the first semiconductor chip comprises a radiation exit surface, via which at least 50% or at least 75% or at least 95% of the entire radiation emitted by the first semiconductor chip is emitted during operation.

The first semiconductor chip is a so-called thin-film chip, for example. In this case, generally the carrier substrate is different than the growth substrate and the growth substrate is detached. In particular, the radiation exit surface then forms an outer surface of the first semiconductor chip which runs substantially parallel to the main extension plane of the active region.

Alternatively, the first optoelectronic semiconductor chip can be a so-called volume emitter, such as a flip-chip or sapphire chip, for example. By way of example, in this case, the carrier substrate is the growth substrate. Preferably, the carrier substrate is transparent to the electromagnetic radiation generated in the active region. A volume emitter emits the electromagnetic radiation generated in the active region preferably via a main outer surface of the carrier substrate and side surfaces of the carrier substrate. The main outer surface of the carrier substrate is situated opposite the semiconductor layer sequence, in particular. The side surfaces of the carrier substrate run transversely with respect to the main outer surface and connect the main outer surface of the carrier substrate to a surface of the carrier substrate which faces the semiconductor layer sequence. In other words, the main outer surface of the carrier substrate and also side surfaces of the carrier substrate form the radiation exit surface of the volume emitter.

Electrical contacts via which the first optoelectronic semiconductor chip is energized and operated during operation as intended are preferably arranged on a main surface of the first optoelectronic semiconductor chip situated opposite the radiation exit surface. Alternatively or additionally, one of the electrical contacts is arranged on the radiation exit surface. Preferably, said electrical contact is formed from a transparent conductive oxide, such as indium tin oxide, for example.

A lateral extent of the first optoelectronic semiconductor chips is for example in each case between 1 μm and 10 mm inclusive, in particular between 100 μm and 1 mm inclusive. For example, the lateral extent is at most 10 μm or at most 5 µm or at most 3 µm. By way of example, a surface area of the radiation exit surface is approximately 1 mm$^2$.

In accordance with at least one embodiment of the method, a method step C) involves transferring at least some of the first optoelectronic semiconductor chips to a first auxiliary carrier. By way of example, the first semiconductor chips are picked and placed on the first auxiliary carrier individually or in parallel (also known by the term pick-and-place method). Alternatively, the first optoelectronic semiconductor chips are placed and fixed on the first auxiliary carrier by means of direct bonding, for example. By way of example, the first optoelectronic semiconductor chips are arranged onto the first auxiliary carrier at the nodes of a virtual, regular grid. The grid is preferably a rectangular grid, particularly preferably a square grid. The tolerance range for the transfer of the first semiconductor chips is for example at most 2 µm or at most 1 µm. By way of example, the first auxiliary carrier comprises or is formed from silicon or plastic.

In accordance with at least one embodiment of the method, the first optoelectronic semiconductor chips on the first auxiliary carrier are cut to size for adaptation to a predefined shape in a method step D). By way of example, all first semiconductor chips have the same geometric shape after the cutting to size. In particular, after the cutting to size, all first optoelectronic semiconductor chips have the same lateral extents in an x-direction and a y-direction perpendicular thereto. In particular, the lateral extents of each first optoelectronic semiconductor chip change by less than 20% or less than 10% as a result of the cutting to size. Particularly preferably, after the cutting to size, each two adjacent first optoelectronic semiconductor chips, along the x-direction and the y-direction, are at the same distance from one another. The cutting to size can be affected by a laser or by means of an etching method, for example. Advantageously, the cutting to size can be carried out particularly precisely.

In accordance with at least one embodiment of the method, a method step E) involves transferring the first optoelectronic semiconductor chips from the first auxiliary carrier to a carrier. Preferably, each two first optoelectronic semiconductor chips are at the same distance from one another on the carrier as on the first auxiliary carrier. The carrier is a final carrier, for example, on which the first semiconductor chips are fixedly and permanently secured, for example by soldering or adhesive bonding or bonding or direct bonding or wafer-to-wafer bonding. The carrier is then a silicon carrier with an integrated circuit, for example. The final carrier is, in particular, a carrier on which the first optoelectronic semiconductor chips are arranged in a finished lighting device. Alternatively, the first optoelectronic semiconductor chips, for further processing, can be detached again from the carrier and be transferred to one further or a plurality of further carriers.

In at least one embodiment of the method for producing a lighting device, this method comprises a method step A) that involves providing a wafer assemblage having a semiconductor layer sequence arranged on a carrier substrate. Furthermore, the method comprises a method step B) that involves severing the wafer assemblage into a multiplicity of first optoelectronic semiconductor chips each having a section of the semiconductor layer sequence and of the carrier substrate. A further method step C) involves transferring at least some of the first optoelectronic semiconductor chips to a first auxiliary carrier. Furthermore, the method comprises a method step D) that involves cutting to size the first optoelectronic semiconductor chips on the first auxiliary carrier for adaptation to a predefined shape. A further method step E) involves transferring the first optoelectronic semiconductor chips from the first auxiliary carrier to a carrier.

In this case, the method described here is based on the following considerations, inter alia. In order to produce a pixelated lighting device, a continuous semiconductor layer sequence having for example substantially the same lateral extent as the finished lighting device can be subdivided into mutually independently operable segments. What is disadvantageous in that case is that the semiconductor layer sequence is not free of defects in the crystal lattice. These defects produce pixel faults in the finished lighting device which, owing to the manner of construction, are virtually impossible to eliminate. Alternatively, the individual segments of the lighting device could be made up of individual first optoelectronic semiconductor chips. However, an image offset arises in this case on account of the high tolerance ranges when transferring the individual first optoelectronic semiconductor chips to the final carrier. Particularly if the first optoelectronic semiconductor chips have a lateral extent of 5 µm or less, said image offset is problematic. A further alternative is to process first optoelectronic semiconductor chips on an auxiliary carrier, on which they are pixelated, for example. Afterward, the first optoelectronic semiconductor chips can be combined to form the lighting device as described above. Disadvantages in respect of an image offset arising during combination cannot be compensated for, however.

The method described here makes use of the concept, inter alia, of transferring first optoelectronic semiconductor chips to a first auxiliary carrier and bringing them to a predefined geometric shape there. Afterward, the first semiconductor chips cut to size can be processed further and/or transferred to a further carrier.

Advantageously, for transfer to the auxiliary carrier, it is possible to choose an expedient transfer method, such as a pick-and-place method, which has high tolerances, for example, since distances between the first semiconductor chips can be adapted precisely by means of the cutting to size. An image offset in the finished lighting device can thus be reduced or avoided. Furthermore, cost-effective singulation methods can be used for obtaining the first optoelectronic semiconductor chips from a wafer assemblage since possible disturbing singulation traces can likewise be removed by the cutting to size.

In accordance with at least one embodiment of the method, the first auxiliary carrier has contact pads on a main surface, the contact pads being surrounded and delimited in each case by a contour. In step C) the first optoelectronic semiconductor chips are each arranged on a contact pad. In step D) the first semiconductor chips are cut to size in such a way that they each lie completely within the contour of the assigned contact pad.

The contact pads, in particular the contours of the contact pads, can be optically perceptible on the main surface. Alternatively, the contact pads can each be virtual contact pads. This is taken to mean that the contact pads and the contours are not optically perceptible. The contours and the positions of the contact pads are then stored in a computer, for example. The stored contour is then traversed, for example, during the cutting to size.

In particular, a contour predefines a region in which the first optoelectronic semiconductor chip assigned to said contour is exclusively arranged after the cutting to size. The distances between two different contact pads predefine in particular the distances between two first optoelectronic semiconductor chips after the cutting to size.

By way of example, the first optoelectronic semiconductor chips, before the cutting to size, each have a larger lateral extent than the assigned contact pad. In other words, the first optoelectronic semiconductor chips completely cover in each case the contact pad assigned to them in a plan view of the main surface of the first auxiliary carrier. In this case, the contour of a contact pad predefines the geometric shape of one of the first optoelectronic semiconductor chips assigned to the contact pad after the cutting to size. Advantageously, the geometric shape and the position of the first semiconductor chips on the first auxiliary carrier can thus be defined by a choice of the contact pads.

In accordance with at least one embodiment of the method, the first optoelectronic semiconductor chips are in each case pixelated in a method step F). In particular, the radiation exit surface of each first optoelectronic semiconductor chip is subdivided into a multiplicity of regions. These regions can be driven and operated individually and independently of one another. The regions of the radiation exit surface form pixels of the first optoelectronic semiconductor chip. A pixelated first optoelectronic semiconductor chip has at least 10 or at least 100 or at least 1000 pixels, for example. By way of example, the pixels each have a lateral extent of less than 10 µm, in particular less than 1 µm.

By way of example, by means of a lithographically defined etching process, trenches are in each case introduced into the semiconductor layer sequence of the first optoelectronic semiconductor chips. The trenches can penetrate through the active region. The radiation exit surface is thus preferably subdivided into individual pixels. A suitable electrical contacting of the individual pixels furthermore makes it possible that the individual pixels can be controlled and operated independently of one another.

Alternatively, the pixels can be defined solely by the electrical contacting. By way of example, different sections of the semiconductor layer sequence of the first optoelectronic semiconductor chips are energized in each case independently of one another. Preferably, as a result of the poor conductivity of the semiconductor layer sequence along its main extension plane, an emission of radiation is excited substantially only in regions in which the current is impressed. Advantageously, the radiation exit surface of the first optoelectronic semiconductor chip can thus be subdivided into a plurality of pixels, without parts of the semiconductor layer sequence being removed. The active region of a first semiconductor chip is then also embodied in a continuous fashion after the pixelation, and not severed by trenches.

In accordance with at least one embodiment of the method, method step F) is carried out between method steps D) and E) on the first auxiliary carrier. In particular, the first optoelectronic semiconductor chips are pixelated after they have been cut to size. Advantageously, the first optoelectronic semiconductor chips have then already been adapted to the predefined geometric shape, as a result of which the pixelation can be performed precisely. An image offset in the finished pixelated lighting device can thus advantageously be reduced or avoided.

Alternatively, it is possible for method step F) to be carried out between method step C) and method step D) on the first auxiliary carrier. In particular, the first optoelectronic semiconductor chips are pixelated before the cutting to size. Advantageously, the pixelation can be precisely adapted to desired properties of the finished lighting device even before the first semiconductor chips are cut to size.

In accordance with at least one embodiment of the method, the first semiconductor chips are transferred to the carrier in step E) in such a way that each two adjacent first semiconductor chips are at a lateral distance from one another which corresponds to at least n times and at most n+1 times a lateral extent of the transferred first semiconductor chips, where n is a natural number≥1. In this case, the distance is measured in particular between a side surface of a first semiconductor chip and a side surface of an adjacent first semiconductor chip, the side surfaces facing one another. The side surfaces each run transversely, in particular perpendicularly, with respect to the main extension plane of the first optoelectronic semiconductor chips. The distance thus measures an extent of an interspace between two adjacent first optoelectronic semiconductor chips or the length of the shortest connecting line between the first semiconductor chips. By way of example, the distance between each two first semiconductor chips substantially amounts to a lateral extent of a first optoelectronic semiconductor chip. Advantageously, the distance between two adjacent first optoelectronic semiconductor chips can be predefined particularly precisely by the cutting to size in method step D). Preferably, the distance between each two first semiconductor chips that is produced on the first auxiliary carrier is maintained during the transfer of the first semiconductor chips in step E).

In accordance with at least one embodiment, in a method step G) some second optoelectronic semiconductor chips are transferred to an auxiliary carrier. In a method step H) the second optoelectronic semiconductor chips on the auxiliary carrier are cut to size in order to adapt the second semiconductor chips to a predefined shape. In a method step I) the second optoelectronic semiconductor chips are transferred from the auxiliary carrier to the carrier, in step I) the second optoelectronic semiconductor chips being arranged into regions of the carrier which are free of the already applied first optoelectronic semiconductor chips. In particular, steps G) to I) are thus carried out after steps C) to E). Preferably, step F) is also carried out for the second optoelectronic semiconductor chips. All features disclosed for the first semiconductor chips, in particular with regard to their production and processing on the auxiliary carrier, are also disclosed for the second semiconductor chips. In addition, third, fourth and/or a plurality of further optoelectronic semiconductor chips can also be used in the method. All features disclosed for the first and/or second semiconductor chips, in particular with regard to their production and processing on the auxiliary carrier, are also disclosed for the third, fourth and/or the plurality of further optoelectronic semiconductor chips.

By way of example, the second optoelectronic semiconductor chips are produced from the same wafer assemblage as the first optoelectronic semiconductor chips that have already been applied to the carrier. Alternatively, the second optoelectronic semiconductor chips are produced by severing a further wafer assemblage. Preferably, in this case, the methods used for severing the further wafer assemblage are the same as those used for the wafer assemblage that yielded the first optoelectronic semiconductor chips already applied. With further preference, the second optoelectronic semiconductor chips are transferred to the auxiliary carrier in step G) by the same methods as those by which the already applied optoelectronic semiconductor chips were transferred to the first auxiliary carrier in step C).

By way of example, the second optoelectronic semiconductor chips are cut to size in step H) in such a way that their shape substantially corresponds to the shape of the already applied first optoelectronic semiconductor chips. Preferably, in the case where the auxiliary carrier has contact pads each having a contour, the second optoelectronic semiconductor chips in each case lie within the contour of the assigned contact pad after the cutting to size.

In particular, each two already applied first optoelectronic semiconductor chips on the carrier are at a distance from one another which substantially corresponds to the lateral extent of the second optoelectronic semiconductor chips. Byway of example, the second optoelectronic semiconductor chips are arranged in interspaces between the already applied first optoelectronic semiconductor chips. Advantageously, the second optoelectronic semiconductor chips and the already applied first optoelectronic semiconductor chips were cut to size, whereby the carrier can be equipped with first and second optoelectronic semiconductor chips without gaps. Here and hereinafter "without gaps" means that the distance between two adjacent first and/or second optoelectronic semiconductor chips after applying the second semiconductor chips is at most 500 nm or at most 200 nm or preferably at most 100 nm. In particular, "without gaps" means that two adjacent pixelated semiconductor chips are at a distance from one another which corresponds at most to the lateral extent of a pixel.

Byway of example, each first and second optoelectronic semiconductor chip forms a respective pixel of the lighting device. In particular, the already applied first optoelectronic semiconductor chips and the second optoelectronic semiconductor chips can emit radiation having different color loci. For example, the already applied first optoelectronic semiconductor chips each emit radiation in a blue wavelength range and the second optoelectronic semiconductor chips each emit radiation in a green and/or red wavelength range. In particular, the material systems on which the first and second optoelectronic semiconductor chips are respectively based can be different.

In accordance with at least one embodiment of the method, a second auxiliary carrier, which differs from the first auxiliary carrier, is used when carrying out steps G) to I). By way of example, the second auxiliary carrier comprises the same material as the first auxiliary carrier. Alternatively, the second auxiliary carrier can comprise a material that differs from the material of the first auxiliary carrier. By way of example, the already applied first optoelectronic semiconductor chips were transferred to a first auxiliary carrier and cut to size there before they were applied to the carrier, and the second optoelectronic semiconductor chips are transferred to a second auxiliary carrier and cut to size thereon before they are transferred to the carrier. In addition, the second optoelectronic semiconductor chips can be pixelated on the second auxiliary carrier. Advantageously, the first optoelectronic semiconductor chips on the first auxiliary carrier and the second optoelectronic semiconductor chips on the second auxiliary carrier can be processed in parallel.

In accordance with at least one embodiment of the method, further optoelectronic semiconductor chips are arranged into regions of the carrier which are free of already applied first optoelectronic semiconductor chips, such that the carrier is covered with first optoelectronic semiconductor chips and further optoelectronic semiconductor chips without gaps. Byway of example, the further semiconductor chips are applied after step E).

In accordance with at least one embodiment of the method, in step E) the first optoelectronic semiconductor chips are transferred by means of wafer bonding. By way of example, the first optoelectronic semiconductor chips are transferred from the first auxiliary carrier and also the second optoelectronic semiconductor chips are transferred from the second auxiliary carrier by means of wafer bonding. Advantageously, the transfer of the first optoelectronic semiconductor chips from the first auxiliary carrier to the carrier can be carried out very precisely by means of wafer bonding. By way of example, first optoelectronic semiconductor chips can be transferred with an accuracy of between 50 nm and 200 nm inclusive by means of wafer bonding. Advantageously, the first and/or second optoelectronic semiconductor chips can thus be arranged on the carrier without gaps. It is furthermore advantageously possible for a plurality of first optoelectronic semiconductor chips to be transferred simultaneously by means of wafer bonding.

In accordance with at least one embodiment of the method, the first optoelectronic semiconductor chips are selected depending on at least one optoelectronic property before method step C). Preferably, the second optoelectronic semiconductor chips are also selected depending on at least one optoelectronic property before method step G). Advantageously, first and/or second optoelectronic semiconductor chips which are defective and/or do not comply with the production tolerances of the finished lighting device can thus be sorted out. As a result, the optoelectronic properties of the finished lighting device can be improved. Furthermore, the efficiency of the method can advantageously be improved as well since unsuitable first and/or second optoelectronic semiconductor chips are not transferred.

In accordance with at least one embodiment of the method, the optoelectronic properties of the first optoelectronic semiconductor chips comprise at least one of the following properties: brightness of the first optoelectronic semiconductor chips, color locus of the radiation emitted by first optoelectronic semiconductor chips, emission characteristic of the first optoelectronic semiconductor chips. By way of example, the first optoelectronic semiconductor chips are each intended to have at least one specific brightness depending on their energization. Alternatively or additionally, the radiation emitted by the first optoelectronic semiconductor chips is intended to have substantially a predetermined color locus in each case. Furthermore, for example, the emission characteristic of different first optoelectronic semiconductor chips is intended substantially not to differ from one another. By way of example, the optoelectronic properties can be determined by means of photoluminescence measurements.

In accordance with at least one embodiment of the method, before method step B) a defect density of the semiconductor layer sequence is determined, and the wafer assemblage is separated in method step B) in such a way that a lateral extent of the resulting first optoelectronic semiconductor chips is dependent on the previously determined defect density. By way of example, the defect density is determined by means of high-resolution spectroscopy or x-ray diffraction. By way of example, a lateral extent of the first semiconductor chips is all the smaller, the higher the determined defect density of the wafer assemblage. Advantageously, the number of defects which the first optoelectronic semiconductor chips have can thus be influenced by the choice of their lateral extent in the wafer assemblage separating method.

In accordance with at least one embodiment of the method, the first optoelectronic semiconductor chips are selected depending on a defect density of the semiconductor layer sequence before method step C). Preferably, the second optoelectronic semiconductor chips are selected depending on the defect density before method step G). By way of example, first and second optoelectronic semiconductor chips whose defect density exceeds a tolerance value are sorted out and not processed further. Thus representation faults in the finished lighting device on account of material defects can advantageously be reduced.

In accordance with at least one embodiment of the method, in step D) the first optoelectronic semiconductor chips are each cut to size by means of an etching process. In particular, the second optoelectronic semiconductor chips are likewise cut to size by means of an etching process in step H). For example, the etching process is a dry etching process, in particular a lithographically defined dry etching process. Advantageously, the cutting to size of the first and/or second optoelectronic semiconductor chips can be carried out particularly precisely by means of an etching process.

In accordance with at least one embodiment of the method, the carrier substrate has a smaller lateral extent than the first auxiliary carrier. The carrier preferably has a lateral extent equal to that of the auxiliary carrier. "Lateral extent equal to" means here that the lateral extents differ by at most 5% or at most 2%. By way of example, the first auxiliary carrier and the second auxiliary carrier have the same lateral extent. The lateral extents of the carrier substrate, of the first and second auxiliary carriers and also of the carrier are measured in particular parallel to their respective main extension plane. Advantageously, the first optoelectronic semiconductor chips can be processed more cost-effectively and more efficiently on a first auxiliary carrier having a larger lateral extent than the carrier substrate. By virtue of the same lateral extent of the first auxiliary carrier and of the carrier, the first optoelectronic semiconductor chips can advantageously be transferred from the first auxiliary carrier to the carrier particularly precisely by means of wafer bonding.

In accordance with at least one embodiment of the method, the contact pads of the first auxiliary carrier are formed with a connection means. In particular, the contact pads of the second auxiliary carrier are also formed with a connection means. By way of example, a connection means is arranged in places on a main surface of the first auxiliary carrier and/or of the second auxiliary carrier. Regions of the main surface on which the connection means was arranged then form in particular the contact pads on which the first optoelectronic semiconductor chips are arranged in step C). The contact pads formed by the connection means have a contour. Byway of example, the contact pads are virtual contact pads. The connection means is an adhesive, in particular, and is based on silicone, for example. Byway of example, the connection means is a metal or a dielectric which can be decomposed chemically or thermally, for example. Advantageously, a connection means enables the first and/or second optoelectronic semiconductor chips to be transferred to the first and/or second auxiliary carrier particularly well.

In accordance with at least one embodiment of the method, the carrier substrate of the first optoelectronic semiconductor chips is removed between method steps C) and D). In particular, the mechanical stability of the semiconductor layer sequence is ensured by the first auxiliary carrier in this case. Preferably, in this case, the carrier substrate is a growth substrate for the semiconductor layer sequence.

In accordance with at least one embodiment of the method, when transferring the optoelectronic semiconductor chips in method step E) the first auxiliary carrier is detached from the semiconductor chips. In particular, after method step E) the semiconductor chips on the carrier are free of the first auxiliary carrier.

BRIEF DESCRIPTION OF THE DRAWINGS

Further advantages and advantageous configurations and developments of the method will become apparent from the following exemplary embodiments illustrated in association with schematic drawings.

Elements that are identical, of identical type and act identically are provided with the same reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

DETAILED DESCRIPTION OF ILLUSTRATIVE EMBODIMENTS

Figure 1:
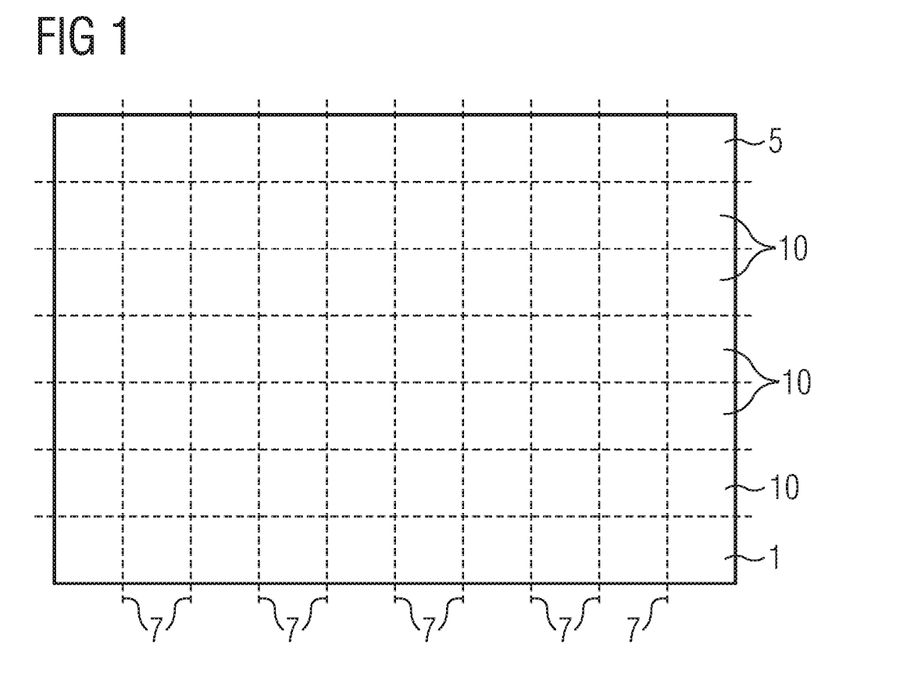
FIGS. 1-7 show method stages of a method for producing a lighting device in accordance with two exemplary embodiments.

In the method in accordance with the exemplary embodiments in FIGS. 1 to 7, firstly a wafer assemblage having a carrier substrate 1 and a semiconductor layer sequence 5 is provided (FIG. 1). The severing of the wafer assemblage is furthermore discernible in FIG. 1. In this case, the semiconductor layer sequence 5 and the carrier substrate 1 are severed along separating lines 7. During the severing, the singulated sections of the semiconductor layer sequence 5 and of the carrier substrate 1 form first optoelectronic semiconductor chips 10. By way of example, the semiconductor layer sequence 5 is based on a nitride compound semiconductor material or a phosphide compound semiconductor material or an arsenide compound semiconductor material and the carrier substrate 1 comprises sapphire or silicon or GaAs, for example. In the present case, the carrier substrate 1 is for example a growth substrate of the semiconductor layer sequence 5.

Figure 2:
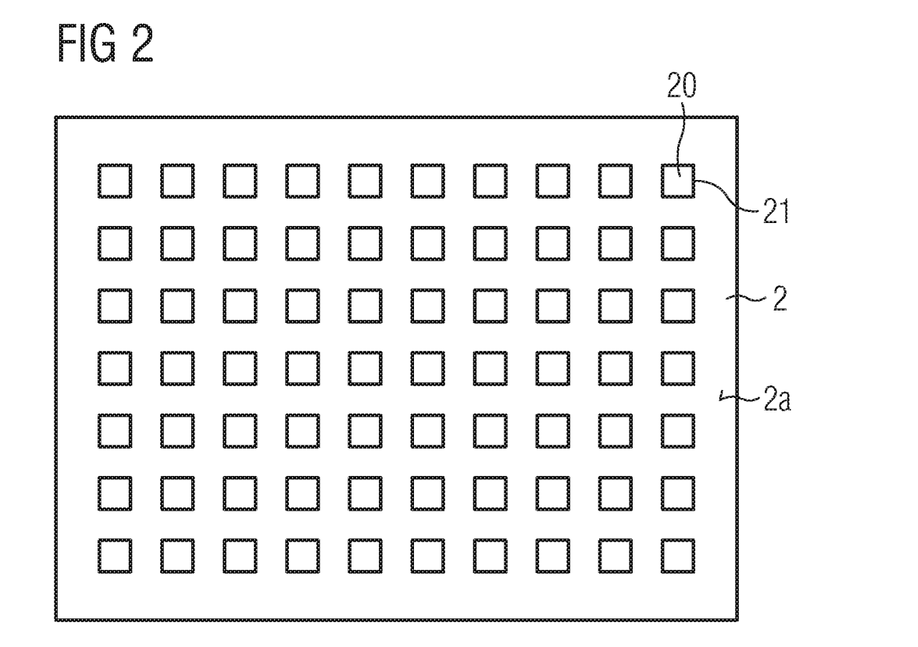

By way of example, the wafer assemblage is severed by means of a dicing method or an etching method, such as, for instance, plasma etching, such as, for example, parallel dicing or stealth dicing. Side surfaces of the first optoelectronic semiconductor chips 10 that run transversely with respect to the main extension plane of the semiconductor layer sequence 5 may have traces of the singulation process. These traces are preferably removed in a subsequent method step. FIG. 2 shows one exemplary embodiment of a first auxiliary carrier 2 such as is used in a method described here before first optoelectronic semiconductor chips 10 are applied. The auxiliary carrier 2 has a main surface 2a with contact pads 20 arranged thereon. The contact pads 20 each have a contour 21. By way of example, the contours 21 are optically perceptible contours. By way of example, the contact pads 20 are arranged at the nodes of a virtual, regular square grid. Alternatively, it is also possible for the contact pads 20 to be formed by a connection means, for example an adhesive, which connects the first optoelectronic semiconductor chips 10 to the first auxiliary carrier 2 in a subsequent method step.

Figure 3:
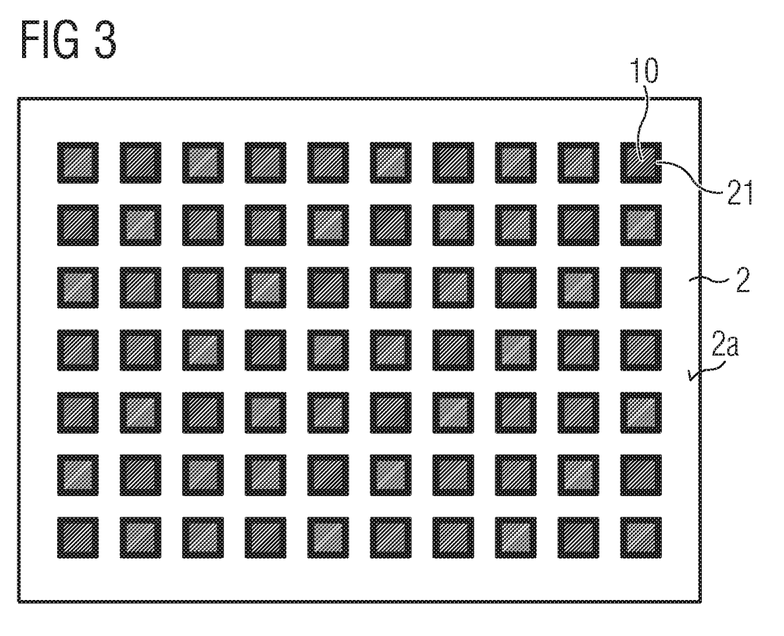

In a further method step C) the first optoelectronic semiconductor chips 10 are arranged on the first auxiliary carrier 2 (FIG. 3). By way of example, at least some of the first optoelectronic semiconductor chips 10 can project beyond the contour 21 of the contact pad 20 respectively assigned to them. In particular, the first optoelectronic semiconductor chips 10 are applied on the first auxiliary carrier 2 by means of a pick-and-place method.

Figure 4:
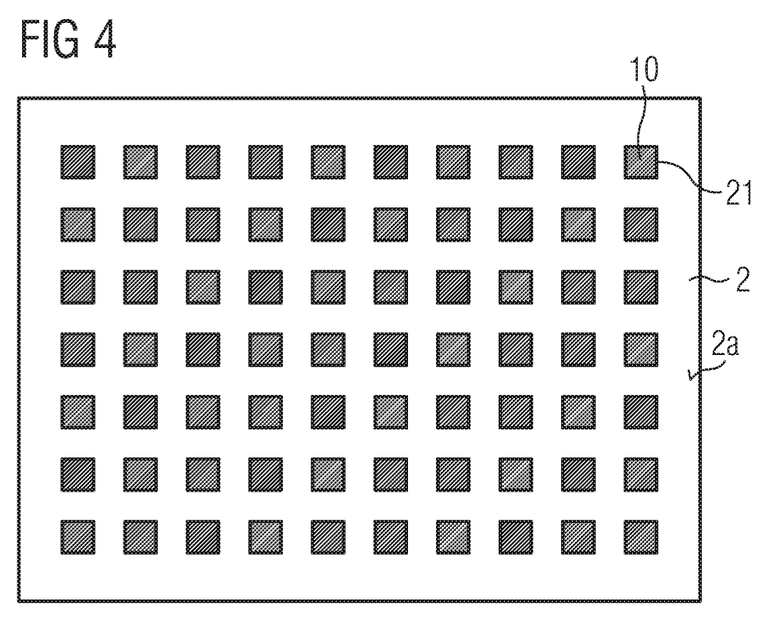

In a further method step D) the first optoelectronic semiconductor chips 10 on the first auxiliary carrier 2 are cut to size (FIG. 4). In particular, the shape of the first optoelectronic semiconductor chips 10 in a plan view of the main surface 2a of the first auxiliary carrier 2 is adapted in such a way that the first optoelectronic semiconductor chips 10 all lie in each case exclusively within the contour 21 assigned to them. By way of example, the first optoelectronic semiconductor chips 10 are cut to size by means of an etching process, in particular by means of a lithographically defined dry etching process. Alternatively, the cutting to size can be affected with the aid of a laser.

Figure 5:
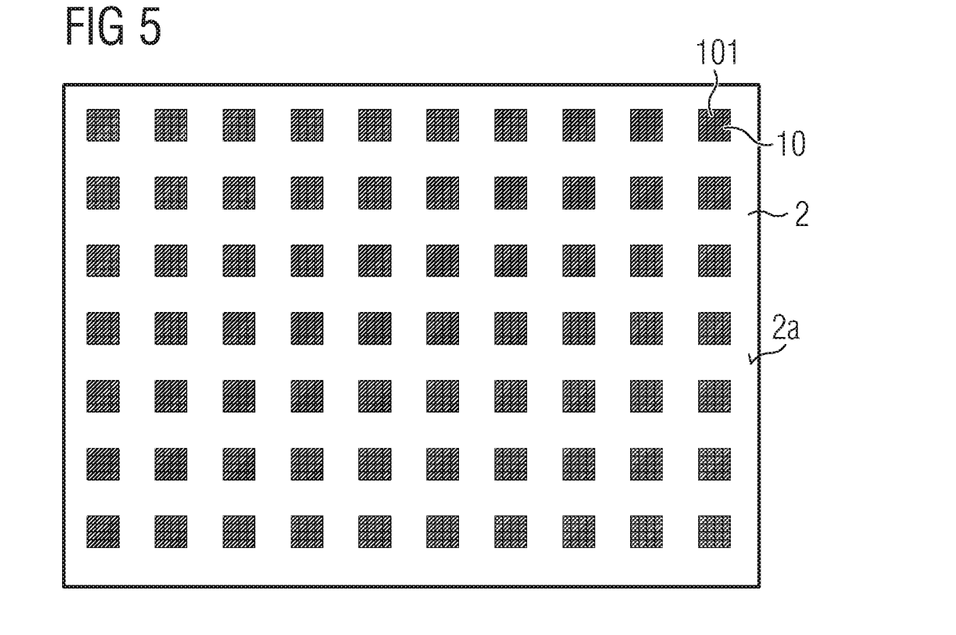

In a subsequent method step F) the first optoelectronic semiconductor chips 10 are each pixelated (FIG. 5). In the present case, method step F) was carried out after method step D), in which the first optoelectronic semiconductor chips 10 were cut to size.

For example, by means of introducing trenches into the semiconductor layer sequence, a multiplicity of pixels 101 are defined at the radiation exit surface of the first optoelectronic semiconductor chips 10. In this case, the pixels 101 form regions of a radiation exit surface of the first optoelectronic semiconductor chips 10 which can be controlled and operated independently of one another. For example, each first optoelectronic semiconductor chip has at least 10 or at least 100 pixels 101.

As an alternative to introducing trenches, it is also possible for the pixels 101 each to be defined exclusively via an electrical contacting of the first optoelectronic semiconductor chips 10. For example, different sections of the semiconductor layer sequence 5 of the first optoelectronic semiconductor chips 10 are energized in each case independently of one another.

Figure 6:
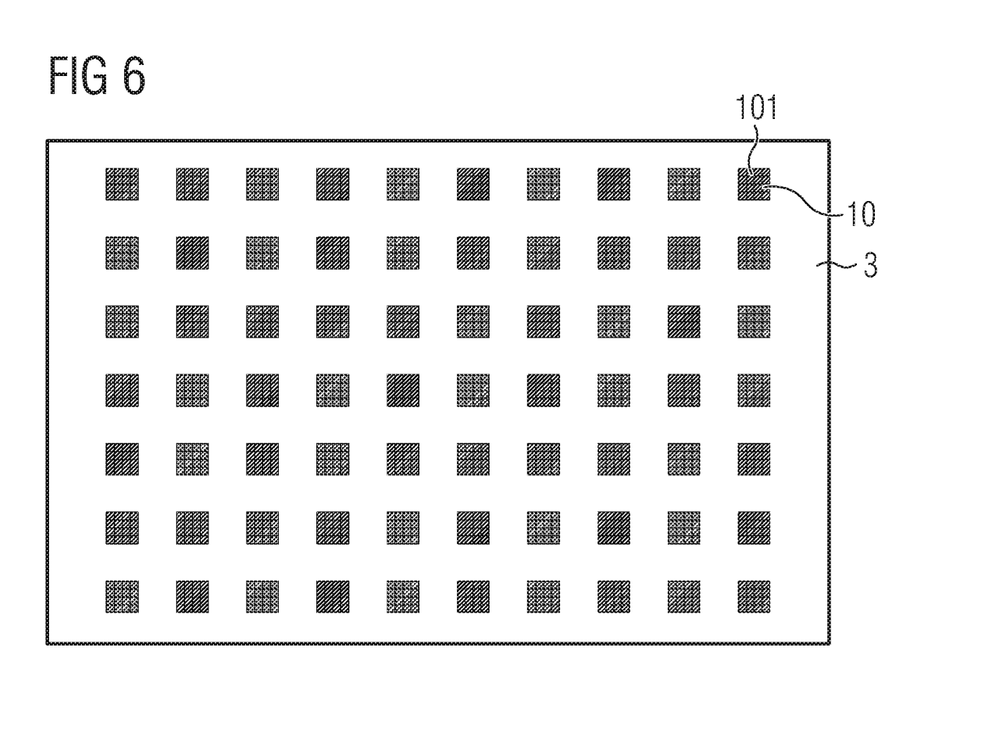

In a further method step E) the first optoelectronic semiconductor chips 10 are applied to a carrier 3 (FIG. 6). Preferably, the first optoelectronic semiconductor chips 10 are transferred from the first auxiliary carrier 2 to the carrier 3 by means of wafer bonding. In particular, the first auxiliary carrier 2 and the carrier 3 have the same lateral extents. The first optoelectronic semiconductor chips 10 can thus be transferred to the carrier 3 in such a way that they are in each case at the same distances on the carrier 3 as on the first auxiliary carrier 2. By way of example, the first optoelectronic semiconductor chips 10 are arranged on the carrier 3 at the nodes of a virtual, regular square grid. A distance between two different first optoelectronic semiconductor chips 10, measured between two side surfaces facing one another, along a virtual grid line preferably substantially corresponds to the lateral extent of the first optoelectronic semiconductor chip 10 in this direction. Byway of example, an interspace between two adjacent first optoelectronic semiconductor chips 10 has a lateral extent such that at least one further first optoelectronic semiconductor chip 10 can be arranged therein. Alternatively or additionally, the interspace between two adjacent first optoelectronic semiconductor chips 10 has a lateral extent such that not more than one further first optoelectronic semiconductor chip 10 can be arranged therein.

The semiconductor chips 10 are free of the first auxiliary carrier 2 in particular after method step E).

Figure 7:
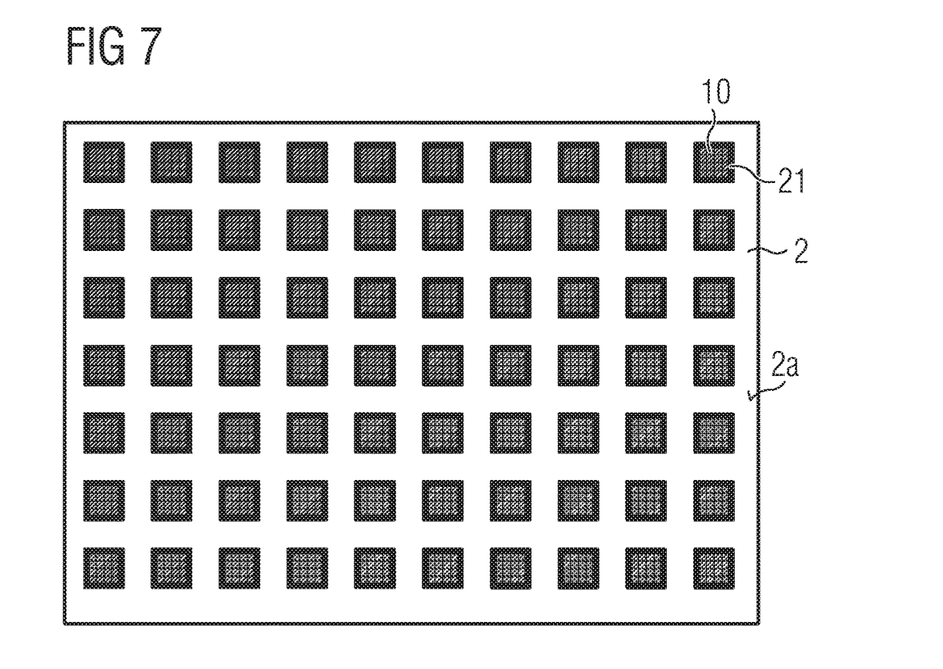

FIG. 7 shows a multiplicity of first optoelectronic semiconductor chips 10 after a method step F) of a method in accordance with a second exemplary embodiment. FIG. 7 shows substantially the same features as FIG. 5 with the difference that method step F) was carried out before the cutting to size of the first optoelectronic semiconductor chips 10.

Figure 8:
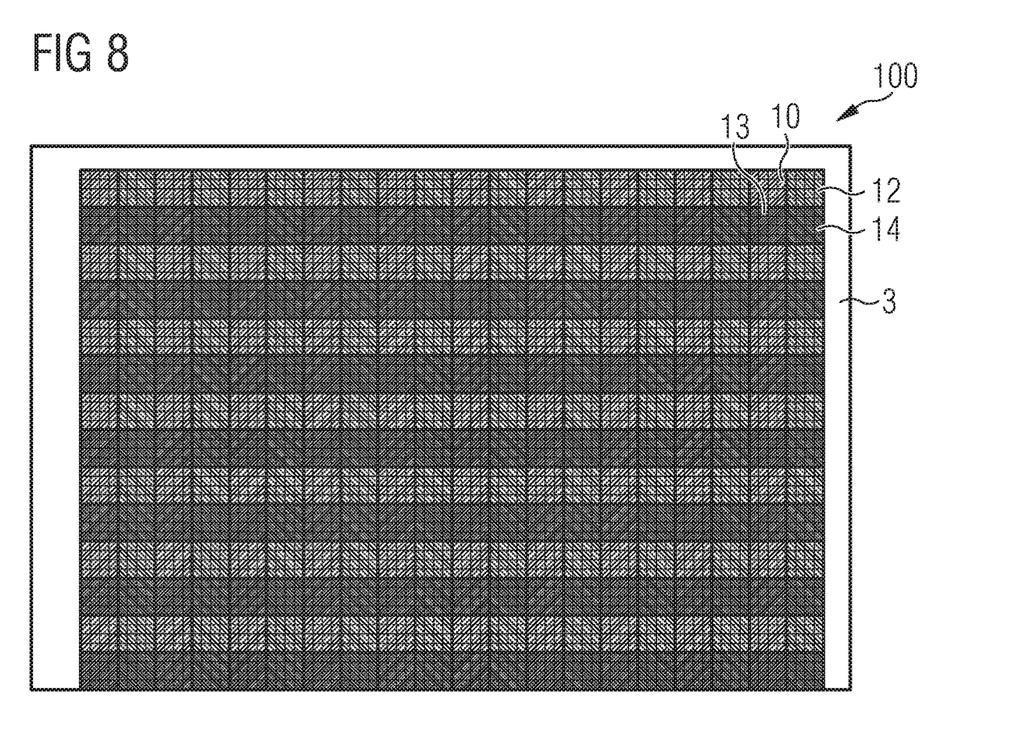
FIG. 8 shows one exemplary embodiment of a lighting device that was produced by the method described here.

FIG. 8 shows a finished lighting device 100 after method steps G), H), I) were carried out after steps C) to E). First optoelectronic semiconductor chips 10 from a first auxiliary carrier, second optoelectronic semiconductor chips 12 from a second auxiliary carrier, third optoelectronic semiconductor chips 13 from a third auxiliary carrier and fourth optoelectronic semiconductor chips 14 from a fourth auxiliary carrier were applied on a carrier 3.

The first optoelectronic semiconductor chips 10, as shown in FIGS. 1 to 6, for example, were cut to size on a first auxiliary carrier 2 (step D)) and subsequently transferred to the carrier 3 (step E)), preferably by means of wafer bonding. The second optoelectronic semiconductor chips 12 were transferred to a second auxiliary carrier (step G)), for example substantially analogously to the first optoelectronic semiconductor chips 10. On the second auxiliary carrier, the second optoelectronic semiconductor chips were cut to size (step H)), pixelated and transferred to the carrier 3 (step G)). In particular, contact pads 20 of the second auxiliary carrier were defined in such a way that during the transfer of the second optoelectronic semiconductor chips 12 from the second auxiliary carrier to the carrier 3, the second optoelectronic semiconductor chips 12 are arranged into regions of the carrier 3 which are free of the already applied first optoelectronic semiconductor chips 10. In an analogous manner, for example, the third optoelectronic semiconductor chips 13 were cut to size on a third auxiliary carrier, pixelated and transferred to the carrier 3. Likewise, for example, the fourth optoelectronic semiconductor chips 14 were cut to size on a fourth auxiliary carrier, pixelated and transferred to the carrier 3.

Alternatively, it is also possible for the optoelectronic semiconductor chips 10, 12, 13, 14 each to be cut to size and pixelated on the same first auxiliary carrier 2 and to be applied to the carrier 3 successively. By way of example, after the first optoelectronic semiconductor chips 10 have been transferred, the first auxiliary carrier 2 is used again in order to cut to size, pixelate and transfer the second optoelectronic semiconductor chips 12.

In this case, during the transfer of the second semiconductor chips 12 to the carrier 3, the first auxiliary carrier 2 is offset with respect to the transfer of the first optoelectronic semiconductor chips 11, such that the second optoelectronic semiconductor chips 12 are arranged into regions of the carrier 3 which are free of the previously transferred first optoelectronic semiconductor chips 11.

Alternatively, further contact pads different than the previously predefined contact pads 20 are predefined on the first auxiliary carrier 2 in the case of a renewed use. By way of example, the further contact pads are offset with respect to the previously predefined contact pads 20, such that the second optoelectronic semiconductor chips 12 are arranged into regions of the carrier 3 which are free of the previously transferred first optoelectronic semiconductor chips 11.

By way of example, the third optoelectronic semiconductor chips 13 and the fourth optoelectronic semiconductor chips 14 are likewise cut to size on the first auxiliary carrier 2, pixelated and transferred to the carrier 3.

Figure 9A:
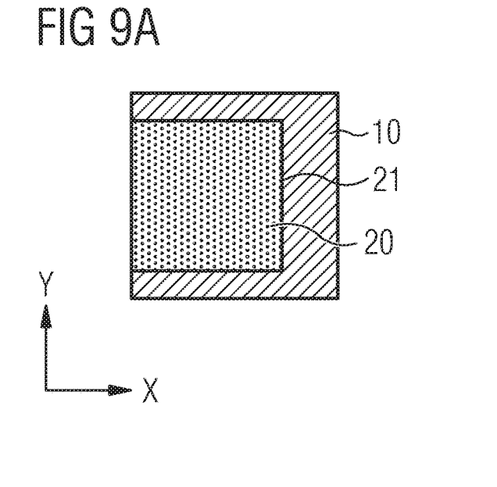
FIGS. 9A-9E show detailed views of various method stages in accordance with a plurality of exemplary embodiments.

FIG. 9A shows a first optoelectronic semiconductor chip 10 after transfer to the first auxiliary carrier 2 in a detailed view. In this case, the first optoelectronic semiconductor chip 10 projects beyond a contour 21 of a contact pad 20. In the present case, the first optoelectronic semiconductor chip 10 has a larger extent than the contact pad 20 in a lateral x-direction X and a lateral y-direction Y. In this case, the lateral y-direction Y is perpendicular to the lateral x-direction X. The first optoelectronic semiconductor chip 10 is offset with respect to the contact pad 20 along the x-direction X, for example on account of a limited accuracy when carrying out method step C). In other words, in a plan view of the contact pad 20, a center point of the first optoelectronic semiconductor chip 10 does not lie over a center point of the contact pad 20.

Figure 9B:
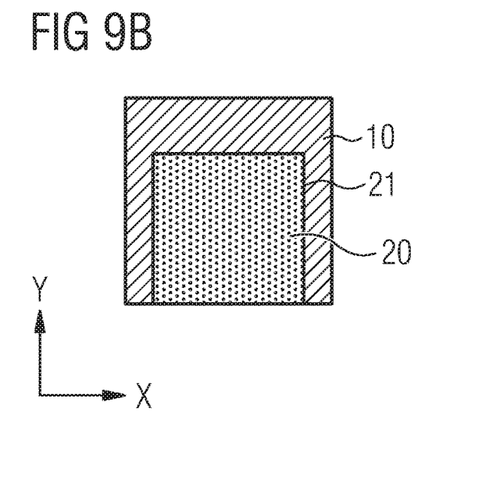

FIG. 9B shows a further first optoelectronic semiconductor chip 10 on a first auxiliary carrier 2. Unlike FIG. 9A, in FIG. 9B the first optoelectronic semiconductor chip 10 is offset with respect to the contact pad 20 along the y-direction Y.

Figure 9C:
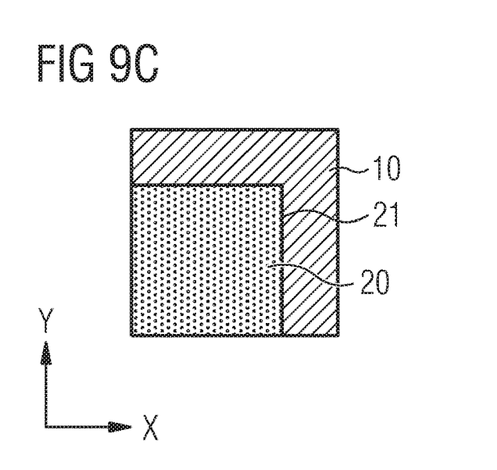

The first optoelectronic semiconductor chip 10 in FIG. 9C is in turn offset with respect to the contact pad 20 in a different lateral direction than the first semiconductor chip 10 in FIG. 9B and in FIG. 9A. In particular, the first optoelectronic semiconductor chip 10 is offset both along the x-direction and along the y-direction.

Figure 9D:
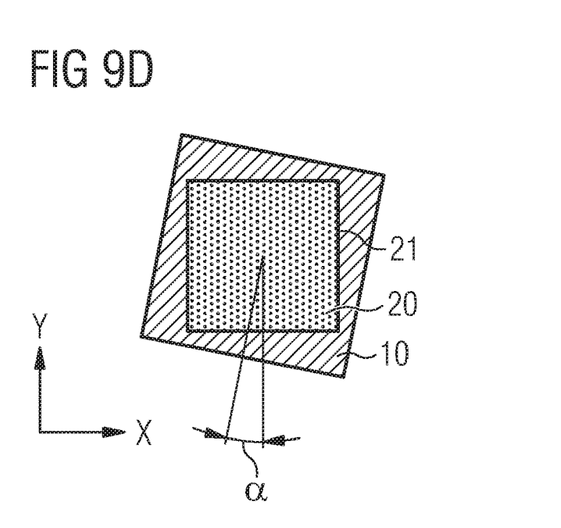

FIG. 9D shows a first optoelectronic semiconductor chip 10 that is rotated by an angle α with respect to a contact pad 20. In other words, no line bounding a rectangular contour 21 of the contact pad 20 is parallel to a line bounding a rectangular contour of the first optoelectronic semiconductor chip 10.

Figure 9E:
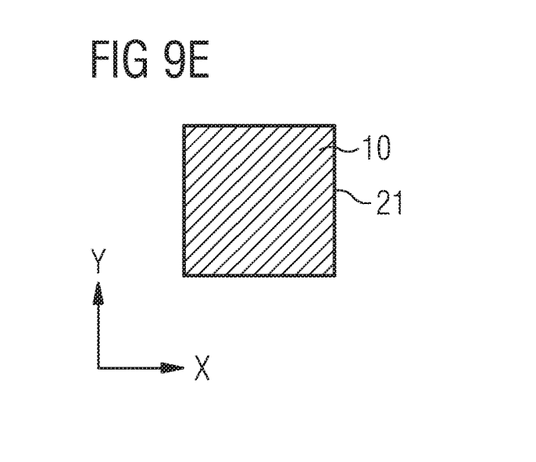

FIG. 9E shows a first optoelectronic semiconductor chip 10 in a detail view after it was cut to size in a method step D). The first optoelectronic semiconductor chip 10 can be a first optoelectronic semiconductor chip 10 in accordance with FIGS. 9A to 9D. Advantageously, by means of method step D), an offset or a rotation of the first optoelectronic semiconductor chip 10 on account of the limited accuracy of the placement method in step C) can be compensated for and the first optoelectronic semiconductor chips 10 from FIGS. 9A to 9D can all be brought to the same geometric shape.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A method for producing a lighting device, the method comprising:
providing a wafer assemblage having a semiconductor layer sequence arranged on a carrier substrate;
separating the wafer assemblage into a plurality of first optoelectronic semiconductor chips, each comprising a section of the semiconductor layer sequence and of the carrier substrate;
transferring at least some of the first optoelectronic semiconductor chips to a first auxiliary carrier, wherein the first auxiliary carrier has contact pads on a main surface, wherein the contact pads are surrounded and delimited in each case by a contour, and wherein each of the first optoelectronic semiconductor chips is arranged on a contact pad;
cutting, on the first auxiliary carrier, to size the first optoelectronic semiconductor chips in order to adapt the first optoelectronic semiconductor chips to a predefined shape such that each first optoelectronic semiconductor chip lies completely within the contour of an assigned contact pad; and
transferring the first optoelectronic semiconductor chips from the first auxiliary carrier to a carrier.

2. The method as claimed in claim 1, further comprising:
pixelating the first optoelectronic semiconductor chips in each case.

3. The method as claimed in claim 2, wherein pixelating is carried out between cutting to size the first optoelectronic semiconductor chips and transferring the first optoelectronic semiconductor chips from the first auxiliary carrier to the carrier.

4. The method as claimed in claim 1, wherein the first optoelectronic semiconductor chips are transferred to the carrier such that each two adjacent first semiconductor chips are at a lateral distance from one another which corresponds to at least n times and at most n+1 times a lateral extent of the transferred first semiconductor chips, where $n \geq 1$.

5. The method as claimed in claim 4, further comprising:
transferring some second optoelectronic semiconductor chips are transferred to a second auxiliary carrier;
cutting the second optoelectronic semiconductor chips on the second auxiliary carrier to size in order to adapt the second optoelectronic semiconductor chips to a predefined shape; and
transferring the second optoelectronic semiconductor chips from the second auxiliary carrier to the carrier,
wherein the second optoelectronic semiconductor chips are arranged into regions of the carrier which are free of the already applied first optoelectronic semiconductor chips.

6. The method as claimed in claim 5, wherein the first auxiliary carrier is different from the second auxiliary carrier.

7. The method as claimed in claim 4, wherein further optoelectronic semiconductor chips are arranged into regions of the carrier which are free of already applied first optoelectronic semiconductor chips such that the carrier is covered with first optoelectronic semiconductor chips and further optoelectronic semiconductor chips without gaps.

8. The method as claimed in claim 1, wherein transferring the first optoelectronic semiconductor chips from the first auxiliary carrier to the carrier comprises transferring the first optoelectronic semiconductor chips by wafer bonding.

9. The method as claimed in claim 1, wherein the first optoelectronic semiconductor chips are selected depending on at least one optoelectronic property before transferring the at least some of the first optoelectronic semiconductor chips to the first auxiliary carrier.

10. The method as claimed in claim 9, wherein the optoelectronic properties of the first optoelectronic semiconductor chips comprise at least one of the following properties: brightness of the first optoelectronic semiconductor chips, color locus of radiation to be emitted by the first optoelectronic semiconductor chips, or emission characteristic of the first optoelectronic semiconductor chips.

11. The method as claimed in claim 1, further comprising:
before separating the wafer assemblage, determining a defect density of the semiconductor layer sequence,
wherein the wafer assemblage is separated such that a lateral extent of resulting first optoelectronic semiconductor chips depends on a previously determined defect density.

12. The method as claimed in claim 1, wherein the first optoelectronic semiconductor chips are selected depending on a defect density of the semiconductor layer sequence before transferring the at least some of the first optoelectronic semiconductor chips to the first auxiliary carrier.

13. The method as claimed in claim 1, wherein the first optoelectronic semiconductor chips are cut to size by an etching process.

14. The method as claimed in claim 1,
wherein the carrier substrate has a smaller lateral extent than the first auxiliary carrier, and
wherein the carrier has a lateral extent identical to that of the first auxiliary carrier.

15. The method as claimed in claim 1, wherein the contact pads of the first auxiliary carrier are formed with a connection means.

16. The method as claimed in claim 1, further comprising removing the carrier substrate of the first optoelectronic semiconductor chips between transferring the at least some of the first optoelectronic semiconductor chips to the first auxiliary carrier and cutting to size the first optoelectronic semiconductor chips.

17. The method as claimed in claim 1, wherein transferring the first optoelectronic semiconductor chips from the first auxiliary carrier to the carrier comprises detaching the first auxiliary carrier from the first optoelectronic semiconductor chips.

\* \* \* \* \*

UNITED STATES PATENT AND TRADEMARK OFFICE
CERTIFICATE OF CORRECTION

PATENT NO. : 12,211,826 B2
APPLICATION NO. : 17/769407
DATED : January 28, 2025
INVENTOR(S) : Kreiner et al.

Page 1 of 1

It is certified that error appears in the above-identified patent and that said Letters Patent is hereby corrected as shown below:

In the Claims

In Column 14, in Claim 5, Line 20, after "chips" delete "are transferred".

Signed and Sealed this
Eleventh Day of March, 2025

Coke Morgan Stewart
*Acting Director of the United States Patent and Trademark Office*